United States Patent
Yoshii et al.

(10) Patent No.: US 6,953,954 B2
(45) Date of Patent: Oct. 11, 2005

(54) PLASMA OSCILLATION SWITCHING DEVICE

(75) Inventors: Shigeo Yoshii, Hirakata (JP); Nobuyuki Otsuka, Kawanishi (JP); Koichi Mizuno, Nara (JP); Asamira Suzuki, Osaka (JP); Toshiya Yokogawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 45 days.

(21) Appl. No.: 10/745,567

(22) Filed: Dec. 29, 2003

(65) Prior Publication Data

US 2004/0135169 A1 Jul. 15, 2004

Related U.S. Application Data

(63) Continuation of application No. PCT/JP03/12469, filed on Sep. 30, 2003.

(30) Foreign Application Priority Data

Oct. 9, 2002 (JP) .......................................... 2002-296220

(51) Int. Cl.[7] .............................................. H01L 29/43
(52) U.S. Cl. .......................... 257/194; 257/192; 257/289
(58) Field of Search .......................... 257/153, 192–194, 257/289

(56) References Cited

U.S. PATENT DOCUMENTS

| | | | |
|---|---|---|---|
| 4,835,581 A | | 5/1989 | Kuroda et al. |
| 4,862,228 A | * | 8/1989 | Ralph .......................... 257/14 |
| 5,001,536 A | * | 3/1991 | Fukuzawa et al. .......... 257/192 |
| 5,144,378 A | * | 9/1992 | Hikosaka .................... 257/194 |

FOREIGN PATENT DOCUMENTS

| | | |
|---|---|---|
| EP | 0 256 360 A2 | 2/1988 |
| JP | 6-85284 | 3/1994 |
| JP | 8-139306 | 5/1996 |
| JP | 8-274346 | 10/1996 |
| JP | 2000-252458 A | 9/2000 |
| JP | 2000-294767 A | 10/2000 |
| JP | 2000-294768 A | 10/2000 |

OTHER PUBLICATIONS

M. Dyakonov et al., "Detection, Mixing, and Frequency Multiplication of Terahertz Radiation by Two–Dimensional Electronic Fluid", IEEE Transactions on Electron Devices, vol. 43, No. 3, Mar. 1996, pp. 380–387.

(Continued)

*Primary Examiner*—Allan R. Wilson
(74) *Attorney, Agent, or Firm*—McDermott Will & Emery LLP

(57) ABSTRACT

A plasma oscillation switching device of the present invention comprises semiconductor substrate 101; first barrier layer 103 that is composed of a III-V compound semiconductor and formed on the substrate; channel layer 104 that is composed of a III-V compound semiconductor and formed on the first barrier layer; second barrier layer 105 that is composed of a III-V compound semiconductor and formed on the channel layer; source electrode 107, gate electrode 109 and drain electrode 108 provided on the second barrier layer, wherein the first barrier layer includes n-type diffusion layer 103a, the second barrier layer includes p-type diffusion layer 105a, the band gap of the channel layer is smaller than the band gaps of the first and the second barrier layers, two-dimensional electron gas EG is accumulated at the conduction band at the boundary between the first barrier layer and the channel layer, two-dimensional hole gas HG is accumulated at the valence band at the boundary between the second barrier layer and the channel layer, and these electrodes are formed on the barrier layer through the insulating layer 106.

14 Claims, 4 Drawing Sheets

OTHER PUBLICATIONS

S.K. Tewksbury, "Formation of high density electron–hole plasma in silicon metal–oxide–semiconductor transistors below 25° K", J. Appl. Phys., vol. 54, No. 2, Feb. 1983, pp. 868–875.

M. Dyakonov et al., "Shallow Water Analogy for a Ballistic Field Effect Transistor: New Mechanism of Plasma Wave Generation by dc Current", Physical Review Letters, vol. 71, No. 15, Oct. 1993, pp. 2465–2468.

V. Ryzhii et al., "Analysis of Tunneling–Injection Transit–Time Effects and Self–Excitation of Terahertz Plasma Oscillations in High–Electron–Mobility Transistors", Jpn. J. Appl. Phys., vol. 41, (2002), pp. L922–L924.

* cited by examiner

PLASMA OSCILLATION SWITCHING DEVICE

This application is a Continuation of International Application No. PCT/JP03/12469, filed on Sep. 9, 2003.

TECHNICAL FIELD

The present invention relates to a semiconductor device, in particular, to a plasma oscillation switching device that operates at a high frequency band.

BACKGROUND ART

In conventional semiconductor devices, operation speed is improved mainly by miniaturizing the structure thereof. For example, in a high electron mobility transistor, the diffusion of impurities can be effectively prevented and the operating speed can be improved by using two-dimensionally distributed electrons. However, in such semiconductor devices, signal transmission is conducted by the migration of a charge (electrons), and the migration speed is restricted by the saturation speed of the material. Therefore, there is a limitation to any attempt to shorten the channel transit time, making high-speed operation difficult. Under these circumstances, in order to realize high-speed operation, the structure of the device must be further miniaturized. Therefore, it has been reported that, for example, a micro-machining technique at a scale of 0.1 $\mu$m or less is required for forming the gate of a device so that high-speed operation at hundreds of GHz can be achieved.

To overcome such a drawback, a semiconductor device wherein the charge transit is not directly involved in signal transmission has been proposed. For example, document 1 (Phys. Rev. Lett. V. 71(1993), p. 2465) and document 2 (IEEE Trans. Elect. Dev. V. 43(1996), p. 380), both written by M. Dyakonov and M. Shur, propose a device using the plasma oscillation of a highly concentrated electron fluid in an FET channel. FIG. 7 is a cross-sectional view of the FET device of document 1. Document 3 (Japanese Unexamined Patent Publication No. 1996-139306) proposes an electromagnetic wave amplifying device that uses the phenomenon of binary instability that occurs in a binary system comprising positive holes and electrons or heavy electrons and light electrons. FIG. 8 is a perspective view of the electromagnetic wave amplifying device disclosed in document 3.

In the prior art techniques, operation at a high frequency band is theoretically feasible; however, they are not very practical because of drawbacks such as a limited operating range, difficulties in the input and output of signals, a complicated structure, etc. For example, in the structure of the devices disclosed in documents 1 and 2, it is reported that electromagnetic wave oscillation at a high frequency, frequency multiplication, and detection of electromagnetic waves are possible; however, these were not fully verified by experiments except for the detection of an initial response. One of the factors preventing the practical application of these techniques is that, for example, in the FET device disclosed in document 1 and shown in FIG. 7, it is difficult to couple the input/output of the signals with the plasma oscillation in the device.

Japanese Unexamined Patent Publication No. 2000-294768 discloses a semiconductor device as described below in which leak current passing through an insulating film can be reduced. In the device, an n-type electron supply layer made of AlGaN and an n-type electron transit layer made of GaN are sequentially formed on a sapphire substrate through a buffer layer and a base layer each formed of undoped AlGaN. A gate electrode 17 is formed on the electron transit layer with an insulating film made of AlN in between. The insulating film is grown at a maximum temperature of 900° C., and composed of a plurality of columnar crystal grains. The maximum depth of the gaps between the columnar crystal grains on the surface of the insulating film on the gate electrode side is 80% or less of the thickness of the insulating film, and their average depth is 35% or less of the film thickness. The average diameter of the columnar crystal grains is equal to or less than 40 nm.

Japanese Unexamined Patent Publication No. 2000-252458 discloses a semiconductor device as described below that is capable of suppressing leakage current passing through an insulating film. In the device, on a sapphire substrate, an n-type electron feeding layer made of AlGa and an n-type electron transit layer made of GaN are formed sequentially with a buffer layer and a base layer each formed of undoped AlGaN in between. A gate electrode is formed on the electron transit layer with an insulating film in between. The insulating film has a structure in which a first AlN insulating film and a second $SiO_2$ insulating film are laminated sequentially on the electron transit layer. Leakage current, which is generated if only the first insulating film is formed, can be prevented by providing the second insulating film.

Japanese Unexamined Patent Publication No. 1996-274346 discloses a semiconductor in which high-performance amplifier and mixer circuits are obtained by forming a dual-gate FET that has improved characteristics due to an enhanced gate breakdown withstand voltage strength. To achieve such a structure, the intrinsic partial conductance during voltage control in the dual-gate FET is made larger when the first gate electrode is used than when the second gate electrode is used. At the same time, the drain breakdown withstand voltage strength of the second gate electrode is made larger than that of the first gate electrode. Deterioration of mutual conductance is thereby eliminated to improve the withstand voltage of the device.

The present invention aims to solve the above problems and to provide a plasma oscillation switching device that reliably achieves operation at a high frequency band.

DISCLOSURE OF THE INVENTION

The plasma oscillation switching device of the invention aims at solving the above problems, which comprises: a substrate; a first barrier layer that is composed of a III-V compound semiconductor and formed on the substrate; a channel layer that is composed of a III-V compound semiconductor and formed on the first barrier layer; a second barrier layer that is composed of a III-V compound semiconductor and formed on the channel layer; and a source electrode, a gate electrode and a drain electrode formed on the second barrier layer; wherein the first barrier layer includes either an n-type diffusion layer or a p-type diffusion layer, and the second barrier layer has a diffusion layer of the opposite type, the energy at the conduction band edge (electron potential) of the barrier layer having the n-type diffusion layer is larger than the energy at the conduction band edge of the channel layer, and the energy at the valence band edge of the barrier layer having the p-type diffusion layer is smaller than the energy at the valence band edge of the channel layer; two-dimensional electron gas is accumulated at the boundary between the barrier layer having the n-type diffusion layer and the channel layer, and two-dimensional hole gas is accumulated at the boundary between the barrier layer having the p-type diffusion layer and the channel layer; and the above described electrodes are electrostatically coupled with the two-dimensional electron gas and two-dimensional hole gas.

BEST MODE FOR CARRYING OUT THE INVENTION (First Embodiment)

Figure 1:
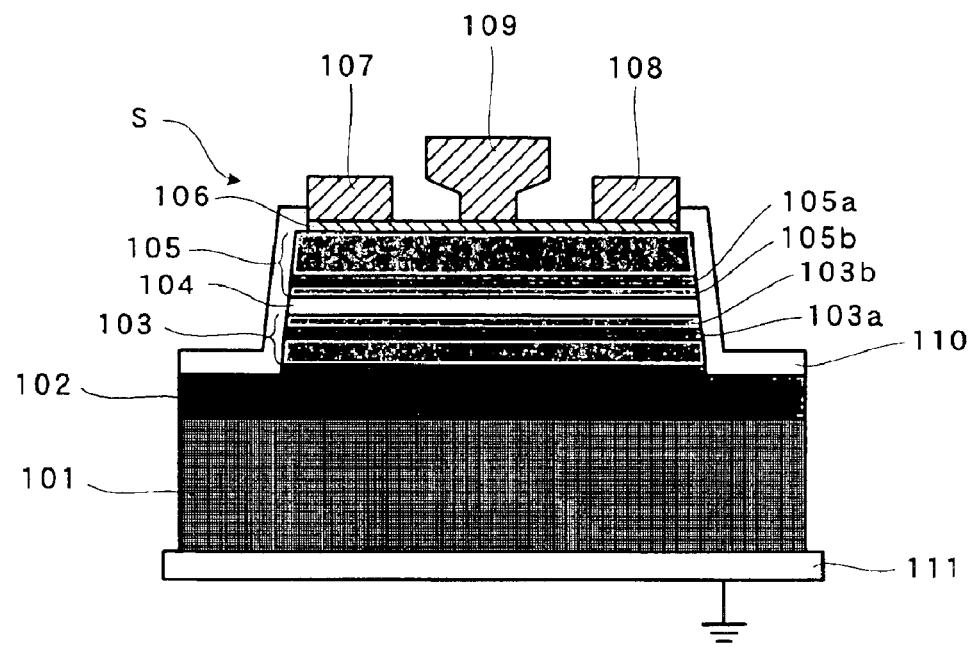
FIG. 1 is a cross-sectional view showing a plasma oscillation switching device according to the first embodiment of the present invention.

Hereunder, a plasma oscillation switching device of the first embodiment of the present invention is explained with reference to the drawings. FIG. 1 is a cross-sectional view showing the plasma oscillation switching device of the present embodiment.

As shown in FIG. 1, the switching device comprises semiconductor substrate 101 composed of Fe doped semi-insulating InP; and a semiconductor laminate S formed on the semiconductor substrate 101. The semiconductor laminate S is formed so that its lattice constant matches that of the semiconductor substrate 101, wherein an undoped InP layer 102 formed by epitaxial growth, first barrier layer 103 formed of InAlAs, channel layer 104 formed of undoped GaInNAs, and a second barrier layer 105 formed of InAlAs are laminated in this order. The InP layer 102 is formed so that its width (the horizontal cross-section width in FIG. 1) is substantially the same as that of the semiconductor substrate 101, and the layers above the InP layer 102 form a mesa shape with narrower widths than the InP layer 102. Most of the first barrier layer 103 is composed of undoped material; however, near its interface with channel layer 104, a first diffusion layer 103a wherein n-type impurities are delta doped is formed. Most of the second barrier layer 105 is also composed of undoped material; and a second diffusion layer 105a wherein p-type impurities are delta doped is formed near the interface with the channel layer 104.

The concentrations of impurities in both the first and second diffusion layers 103a, 105a are from $1\times10^{12}$ to $1\times10^{13}$ cm$^{-2}$. The first and second diffusion layers 103a, 105a are disposed so that both have a predetermined distance between them and the channel layer 104. In other words, in the intervals between the diffusion layer 103a and the channel layer 104 and between the diffusion layer 105a and the channel layer 104, undoped regions of the barrier layer, i.e., 103b and 105b, are disposed, respectively. It is preferable that the distances between the diffusion layers 103a, 105a and the channel layer 104, i.e., the thickness of the undoped layers 103b, 105b be, for example, from 10 nm or greater to 100 nm or less. By arranging these layers having such predetermined distances in between, it is possible to prevent the below-described oscillation of two-dimensional electron gas or two-dimensional hole gas from becoming irregular due to the effect of the diffusion layers 103a, 105a.

On the bottom surface of the semiconductor substrate 101, common electrode 111 made of metal is formed and the electrode 111 is grounded. On the top surface of the semiconductor laminate S, i.e., on top of the second barrier layer 105, insulating layer 106 made of SiO$_2$ is formed and three electrodes are formed on the insulating layer 106. Specifically, gate electrode 109 is in the middle of the three electrodes formed on the insulating layer 106, and source electrode 107 and drain electrode 108 are formed on both sides of the gate electrode 109 having the gate electrode 109 in between. In contrast to conventional high electron mobility transistors, in the switching device of the present embodiment, neither the source electrode 107 nor the drain electrode 108 has ohmic contact with the channel layer 104. The insulating layer 106 may be formed of SiN. The thickness of the insulating layer 106 varies depending on the characteristics of the device; however, preferable thickness thereof is from 20 nm to 100 nm (inclusive). Furthermore, on top of the InP layer 102 and the side faces of the mesa-shaped portion of the semiconductor laminate S, protective insulating layer 110 made of SiO$_2$ is formed, so that the semiconductor laminate S is thereby insulated from the surroundings.

Figure 2:
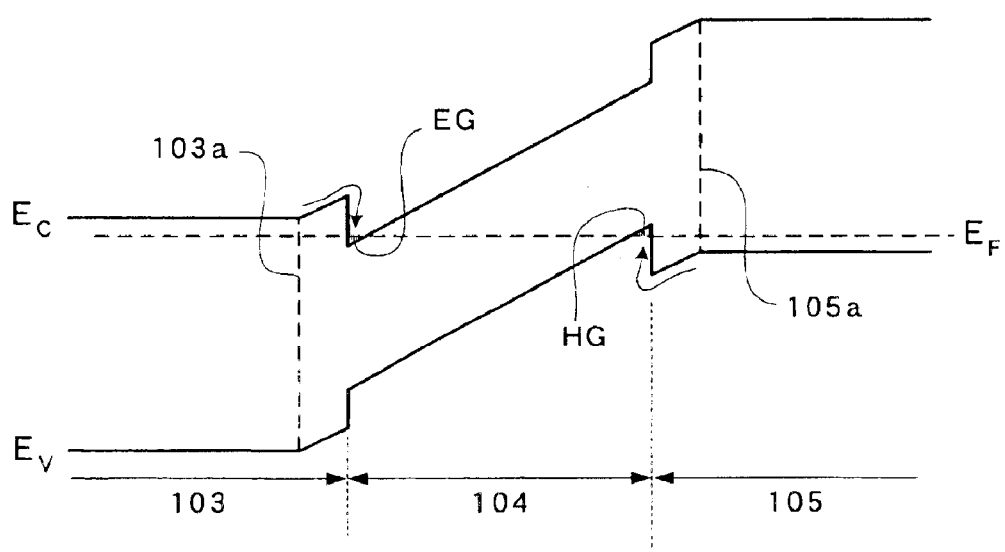
FIG. 2 shows the band gap around the channel layer in FIG. 1.

FIG. 2 shows the band gap structure around the channel layer in the switching device. As shown in FIG. 2, the band gap in the channel layer 104 is smaller than that in the first barrier layer 103 and the second barrier layer 105, so that a band offset is thereby formed. At the boundaries between the first barrier layer 103 and the channel layer 104, and between the second barrier layer 105 and the channel layer 104, charges supplied from the first and second diffusion layers 103a, 105a accumulate, forming two-dimensional distributions. In other words, because n-type impurities are doped in the first diffusion layer 103a, electrons in this portion accumulate in conduction band E$_C$ that is offset at the boundary between the first barrier layer 103 and the channel layer 104, forming two-dimensional electron gas EG (also called "two-dimensional electron fluid"). On the other hand, because p-type impurities are doped in the second diffusion layer 105a, holes in this portion accumulate in valence band E$_V$ that is offset at the boundary between the second barrier layer 105 and the channel layer 104, forming two-dimensional hole gas HG (also called "two-dimensional hole fluid"). The densities of electric charge of the two-dimensional electron gas EG and hole gas HG substantially correspond to the densities of the impurities added, and both are from $1\times10^{12}$ to $1\times10^{13}$ cm$^{-2}$.

In FIG. 2, Fermi level E$_F$ is the electron chemical potential, which is the energy having an electron distribution function of 0.5. In the conduction band Ec, a high concentration of electrons (EG) exists below the Fermi level E$_F$, and, in the valence band Ev, a high concentration of holes (HG) exists above the Fermi level E$_F$.

Operation of the switching device having the above structure is explained below. First, signals having a frequency of not lower than 10 GHz and not higher than 1000 GHz are applied to the source electrode 107. Because high two-dimensional concentrations of charges are accumulated in the two-dimensional electron gas EG and two-dimensional hole gas HG, and the two-dimensional electron gas EG and two-dimensional hole gas HG are electrostatically coupled to the source electrode 107, when high frequency signals are applied thereto, plasma oscillations occur both in the two-dimensional electron gas EG and hole gas HG. In the switching device of the present embodiment, the two-dimensional electron gas EG and the two-dimensional hole gas HG are closely disposed in parallel, and therefore the plasma oscillations are readily coupled to each other and stably propagated. Because migration of charges at a speed exceeding the phase speed of the plasma oscillation does not occur in the channel. layer 104, the phenomenon of binary instability does not arise. Because the drain electrode 108 is also electrostatically coupled to the two-dimensional electron gas EG and the two-dimensional hole gas HG, the plasma oscillation propagated from the source electrode 107 as described above is output from the drain electrode 108.

Under this condition, when a voltage is applied to the gate electrode 109, the charge density below the gate electrode 109 changes. In particular, when negative voltage is continuously applied to the gate electrode 109, charge density of both electrons and holes decrease, and finally the accumulated amount of charge immediately below the gate electrode becomes 0. This divides the two-dimensional electron gas EG and hole gas HG in the channel layer 104 left and right of the gate electrode 109, and therefore the plasma oscillation propagated from the source electrode 107 cannot reach the drain electrode 108. As described above, by changing the voltage applied to the gate electrode 109, the propagation efficiency of the plasma oscillation immediately below the gate electrode 109 can be varied. Therefore, it is possible to make the device of the present embodiment operate as a modulation device that modulates the intensity of high frequency oscillations. It is also possible to conduct phase modulation using the characteristic that the propagation rate of plasma oscillation changes in accordance with the change of the gate voltage. It is preferable that direct voltage or signals having a frequency of approximately $\frac{1}{10}$–$\frac{1}{1000}$ that of signals applied to the source electrode 107 be applied to the gate electrode 109.

As described above, in the present embodiment, the channel layer 104 having a narrow band gap is sandwiched between the barrier layers 103, 105 that include the diffusion layers 103a, 105a respectively in which impurities are doped, so that the two-dimensional electron gas EG and two-dimensional hole gas HG are thereby formed at the band offsets. Since, high frequency signals are applied to the source electrode 107, which is electrostatically coupled to the electron gas EG and hole gas HG, this allows plasma oscillations to occur in both the electron gas EG and hole gas HG. When these oscillations couple and propagate, transmittance of high frequency signals becomes possible. As described above, in the switching device of the present embodiment, signals are transmitted using not migration of charge but coupled plasma oscillations, and therefore it is possible to transmit high frequency signals without being restricted by the saturation velocity of the electrons and/or holes.

In semiconductor devices using conventional plasma oscillation, it is difficult to couple the signals from the outside electromagnetic field or circuit to the plasma oscillation. Therefore, such devices need to have a special structure or an antenna for coupling. One of the causes of this problem is that plasma oscillation is a longitudinal wave generated by compression charge waves, and therefore the intensity of occurrence of the electric field is small in the direction perpendicular to the two-dimensional electron gas and hole gas. This makes it difficult to couple outside signals to the plasma oscillation. In contrast, in the structure of the present embodiment, because the two-dimensional electron gas and hole gas are coupled to each other, it becomes easier to obtain a more intense electric field in the perpendicular direction than in conventional devices. Therefore, in the region having a high electron density, the hole density also becomes high, resulting in that electric potential of the top surface of the semiconductor laminate S becomes low. This allows changing the charge density of the channel layer 104 by varying the electric potential of the semiconductor laminate S. Therefore, because the electric potentials of the source electrode 107 and drain electrode 108 disposed on the device are coupled to the plasma oscillation in the channel layer 104 at high frequency region, when high frequency signals are applied to the source electrode 107, the signals are propagated in the channel layer 104 as plasma oscillations, and then output from the drain electrode 108.

In the above explanation, electrodes 107, 108 and 109 are formed on the same insulating layer 106; however the structure is not limited to this. Thickness of the insulating layer and the chemical constituents thereof associated with each electrode can vary. For example, below the source electrode 107 and drain electrode 108 where high frequency signals are input or output, it is preferable to make the insulating layer 106 thin to improve the efficiency of input/output signals. In contrast, because signals of relatively low frequency are input to the gate electrode 109, the insulating layer 106 can be made thicker in the region below the gate electrode 109 than below the source electrode 107. Instead of forming electrodes 107, 108 and 109 on the insulating layer 106 on the second barrier layer 105 as described above, it is also possible to connect the electrodes so as to form a Schottky junction with the second barrier layer 105. These structural variations can be applied to the second embodiment described later.

The materials composing the barrier layers 103, 105 and the channel layer 104 are not limited to those described above. Specifically, as long as they are formed from III-V compound semiconductors, not only binary system materials but also ternary, quaternary and quinternary mixed crystal materials can be used. When the channel layer 104 contains In, the band gap can be narrowed and is therefore preferable.

In the present embodiment, GaInNAs that contains N is used to form the channel layer 104. This is because containing N renders the following effects: Generally, the effective mass of electrons is much smaller than that of the holes (positive holes), and therefore the electron mobility is much larger than that of the holes. When the signal frequency is high and the signal wavelength is shorter than the distance between the source and drain, if the mobility of the electrons and that of the holes greatly differ from each other, phase of plasma oscillation might shift during propagation and may become decoupled. In contrast, when N is doped as described above, the effective mass of electrons increases and the mobility of electrons can be slowed down. As a result, the difference in mobility between the electrons and holes can be reduced. This prevents plasma oscillation becoming decoupled, and makes it possible to perform signal transmittance in a stable manner. As one example, the effective mass of electrons when N is doped to GaAs is shown below. The table below shows the change of effective mass of electrons when x in $GaN_xAs_{1-x}$, i.e., content of N, is changed. As shown below, when the content of N increases, effective electron mass also increases, and is therefore preferable. Introduction of N, which is a group V element, greatly affects the conduction band but the effects in the valence band are not so great, and therefore the effective mass of hole (approximately 0.62) does not change very much.

| Content of N (x) | Effective electron mass |
|---|---|
| 0 | 0.067 |
| 0.01 | 0.11 |
| 0.02 | 0.2 |

In a semiconductor mixed crystal that grows on a III-V compound semiconductor substrate, the upper limit the doped N content is approximately 0.1. To maintain excellent crystallinity, the upper limit thereof is approximately 0.07. Given this, it is preferable that the III-V compound semiconductor forming the channel layer 104 contain N and As, and that the content of N, expressed as x in the expression of $N_xAs_{1-x}$, be preferably from 0 to 0.1, more preferably from 0.01 to 0.07 and particularly preferably from 0.02 to 0.05. Herein, effective electron mass means a mass of an electron relative to that of an electron in a vacuum.

In the present embodiment, the semiconductor mixed crystal composing the channel layer 104 has the approximate chemical constitution of Ga(0.2)In(0.8)N(0.04)As(0.96). In particular, it is preferable that a channel layer formed on an InP substrate be a Ga(y)In(1−y)N(x)As(1−x) mixed crystal, wherein y is in the range of 0.47−6.7x±0.26 and x is in the above described range to obtain a semiconductor structure of high quality.

As the channel layer on a GaAs substrate, it is preferable that a Ga(y)In(1−y)N(x)As(1−x) mixed crystal be used with the proviso that y is in the range of 1−2.9x±0.12 and x is in the above described range to obtain a semiconductor structure of high quality.

(Second Embodiment)

Figure 3:
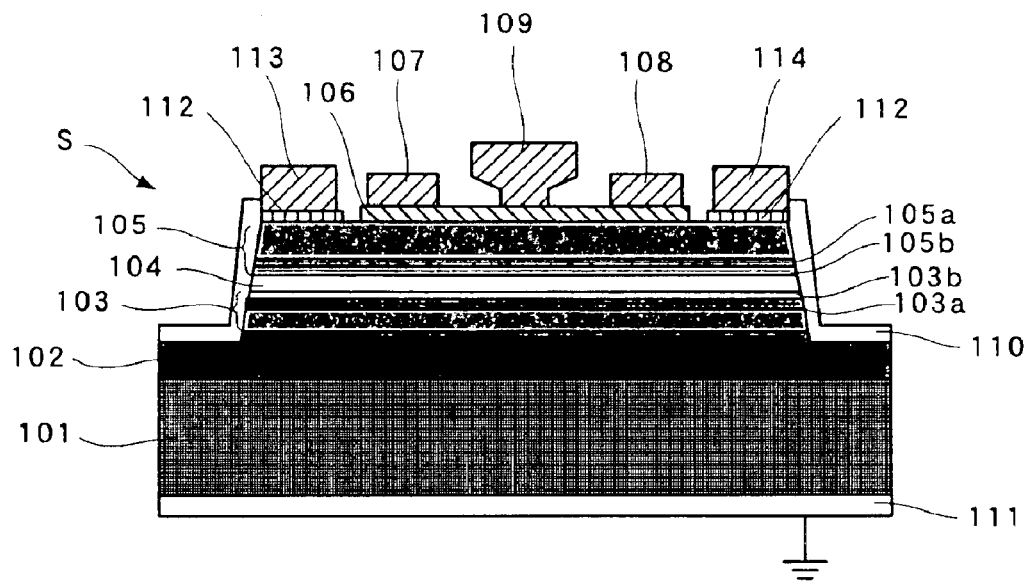
FIG. 3 is a cross-sectional view showing a plasma oscillation switching device according to the second embodiment of the present invention.

Hereunder, the second embodiment of the present invention is explained with reference to the drawings. FIG. 3 is a cross-sectional view of the plasma oscillation switching device of the present embodiment. The plasma oscillation switching device of the second embodiment is different from the first embodiment in the structure of the electrodes; however, the structures of the substrate and laminate are the same as in the first embodiment, and therefore those elements that are identical to the elements of the first embodiment are identified with the same numerical symbols, and detailed explanation thereof will be omitted.

As shown in FIG. 3, in the present embodiment, insulating layer 106 and a pair of contacting layers 112 are formed on the second barrier layer 105 in such a manner that the contacting layers 112 disposed on each side of the barrier layer 105 with the insulating layer 106 in between. On the insulating layer 106, the first source electrode 107, gate electrode 109 and the first drain electrode 108 that have the same structures as explained in the first embodiment are formed. On the contacting layer 112 that is adjacent to the first source electrode 107, the second source electrode 113 is formed, and on the contacting layer 112 that is adjacent to the first drain electrode 108, the second drain electrode 114 is formed. The contacting layers 112 can be formed of, for example, InGaAs having a high concentration of p-type dopants. Therefore, the second source electrode 113 and drain electrode 114 form Ohmic contact with the second barrier layer 105 and two-dimensional hole gas HG.

Operation of a switching device having such a structure is explained below. As explained in the first embodiment, signals of high frequency are input to the first source electrode 107, and direct voltage or signals of relatively low frequency are applied to the gate electrode 109. Plasma oscillations are thereby generated in the two-dimensional electron gas EG and two-dimensional hole gas HG, and these oscillations are coupled to each other and high frequency signals are propagated from the source electrode 107 to the drain electrode 108. Unlike the first embodiment, here a direct voltage is applied across the second source electrode 113 and the drain electrode 114. The second source electrode 113 and drain electrode 114 are connected to the second barrier layer 105 through the contacting layers 112, and therefore they have Ohmic contact with the two-dimensional hole gas HG. Accordingly, for example, when voltage is applied so that the second drain electrode 114 becomes positive, in the two-dimensional hole gas HG, holes migrate from the second drain electrode 114 to the second source electrode 113. In contrast, electrons in the two-dimensional electron gas EG do not migrate.

Figure 4:
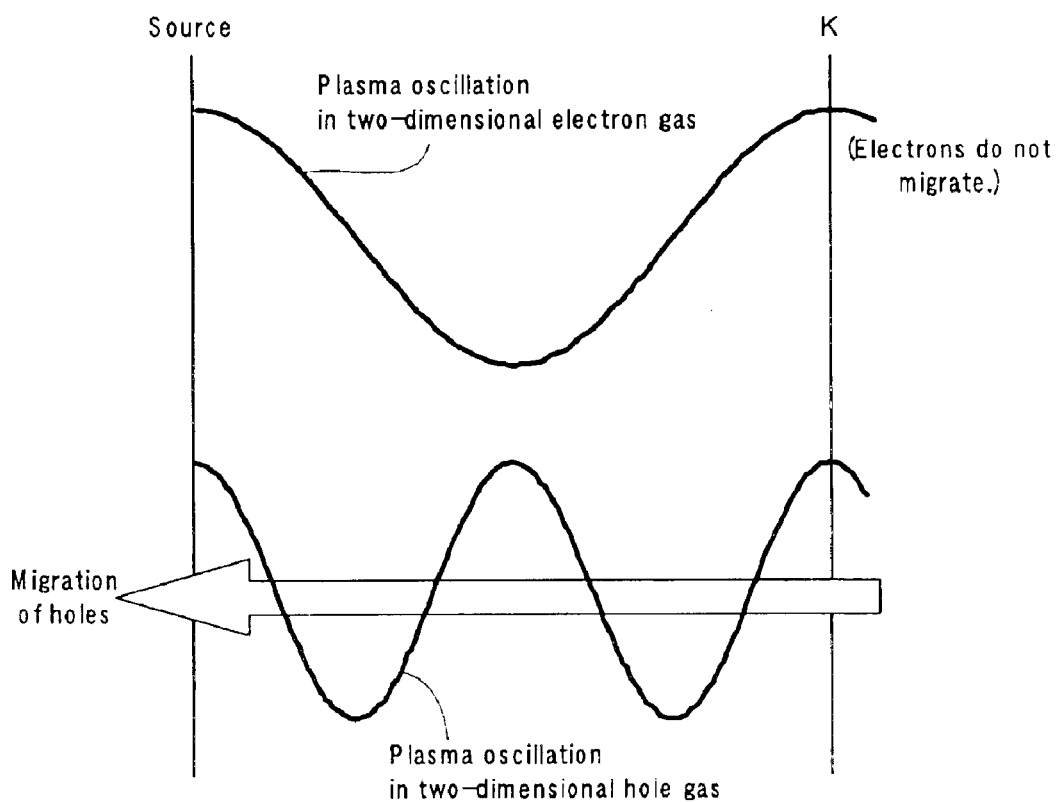
FIG. 4 shows the phase change in plasma oscillation.

When holes migrate as described above, due to the Doppler effect, the plasma oscillation wavelength changes. In other words, as shown in FIG. 4, in the two-dimensional hole gas HG, holes flow in the direction opposite to the oscillation propagation direction, and therefore the wavelength of oscillation is shortened. In contrast, plasma oscillation wavelength in the two-dimensional electrons gas EG does not change. Therefore, the phases of the plasma oscillations generated in each gas gradually shit out of phase as signal propagation progress, and, when the amount shifted becomes coincident with the wavelength, both oscillations become recoupled (for example, on line K). Detailed explanation is given below based on FIG. 4. When the wavelength of the plasma oscillation in the two-dimensional electrons gas EG becomes coincident with n times the wavelength of the oscillation in the hole gas (wherein n is an integer not smaller than 2; in FIG. 4, n=2), both oscillations become recoupled. Therefore, in the drain electrode 108, only those signals having a frequency coincident with the amount of phase change between the source and drain are selectively enhanced and output. The other signals are suppressed by the phase shift in plasma oscillation.

As described above, in the present embodiment, a second source electrode 113 and drain electrode 114, to which direct voltage is applied, are disposed either side of the first source electrode 107 and drain electrode 108. The wavelengths of each plasma oscillation can be changed by the direct current passing across the electrodes, and therefore only signals having a wavelength frequency that is coincident with the amount of phase change can be output. In other words, the plasma oscillation switching device of the present embodiment can serve as a filter that removes signals of a predetermined frequency.

In this case, because the amount of phase shift changes in accordance with the electric current passing across the second source electrode 113 and drain electrode 114, signals of predetermined frequency can be filtered out. When the device is made to serve as a filter as described above, the gate electrode 109 can be omitted. This simplifies the structure and fabrication of the device become easier.

In FIG. 3, the second source and drain electrodes 113, 114 have Ohmic contact with the two-dimensional hole gas HG through the second barrier layer 105. However, it is also possible to provide the second source and drain electrodes 113, 114 on the slope of the mesa shape, or expose a portion of the first barrier layer 103 in a lower part of the mesa portion and provide the second source and drain electrodes 113, 114 on this portion. This makes the fabrication process thereof somewhat complicated; however, this allows the second source and drain electrodes 113, 114 to have Ohmic contact not only with the two-dimensional hole gas HG but also with the two dimensional electron gas EG through the first barrier layer 103. In this case, when electric current is supplied across the second source and drain electrodes 113, 114 both electrons and holes migrate in the two-dimensional electron gas EG and two-dimensional hole gas HG. The same effects described in the above embodiment can be obtained also in this case, since phase shift arises because the migration directions of electrons and holes are opposite to each other.

Figure 5:
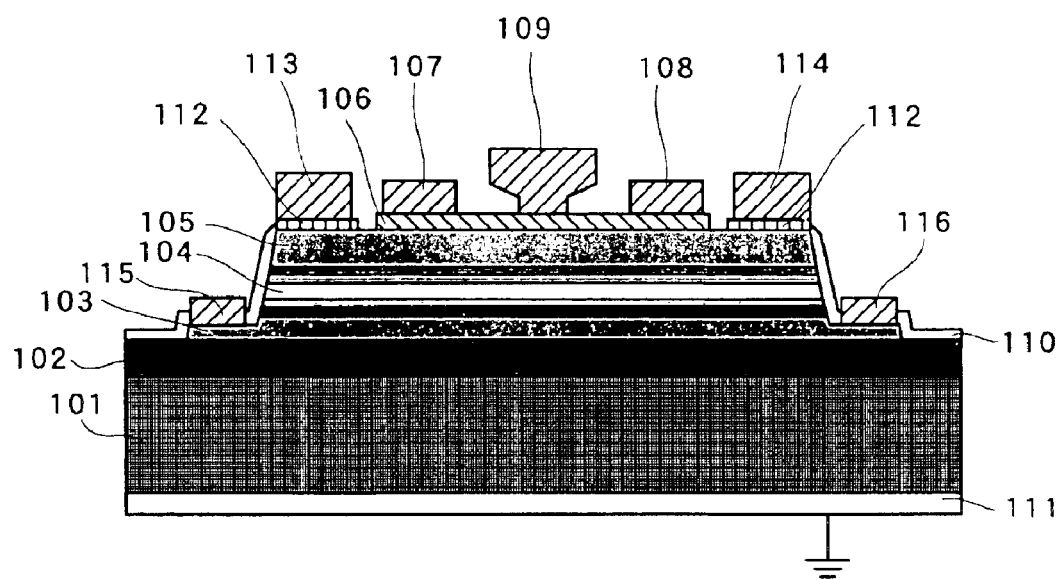
FIG. 5 is a cross-sectional view showing another example of a plasma oscillation switching device according to the second embodiment of the present invention.

Furthermore, as shown in FIG. 5, it is also possible to expose a portion of the first barrier layer 103 in a lower part of the mesa portion and provide, separately from the second source and drain electrodes 113, 114, a third source electrode 115 and a third drain electrode 116 that also have Ohmic contact with the two-dimensional electron gas EG through the first barrier layer 103. This makes the fabrication process thereof even more complicated; however, in this structure, the amount of positive hole migration in the two-dimensional hole gas HG and the amount of electron migration in the two-dimensional electron gas EG can be independently controlled using the second source and drain electrodes 113, 114 and the third source and drain electrodes 115, 116.

In this switching device, by making one of the second source and drain electrodes 113, 114 connect to the ground or supply voltage to make a short circuit as AC, and in the other electrode, by controlling the current to become constant to open the circuit as AC, it is possible to amplify signals and conduct oscillation. In this case, it is also possible to use the device wherein the third source and drain electrodes 115, 116 are provided separately from the second source and drain electrodes 113, 114. In this case, by supplying electric current across the second source and drain electrodes 113, 114 and across the third source and drain electrodes in opposite directions, the migration directions of electrons and positive holes can be made coincident. This is especially preferable because gain can be obtained both across the second source and drain electrodes and across the third source and drain electrodes.

Hereunder, the amplification of signals and oscillation operation in the switching device are explained in further detail. As elucidated by M. Dyakonov and M. Shur, the second (and the third) source and drain electrodes 113, 114 serve as two plasma oscillation boundaries, and the AC-short-circuit electrode becomes the fixed end of the plasma oscillation, and the AC-open electrode becomes the free end. In the device, standing wave of plasma oscillation that corresponds to the distribution of electron gas (or hole gas) arises, and the plasma oscillation can resonate with the electric signals (or electromagnetic wave) having the corresponding frequency. The resonance frequency depends on the plasma oscillation propagation rate. Because the propagation rate depends on the charge density, the resonance frequency can be modulated by changing the gate voltage.

In this device, electric current is supplied in such a manner that electrons (or positive holes) migrate from the fixed end to the free end, and their speeds do not exceed the propagation rate of the plasma oscillation. Under this condition, the free end boundary seemingly approaches to the progressive wave traveling from the fixed end to the free end; as a result, the reflectance of the free end becomes a complex value of which absolute value exceeds 1. To the progressive wave traveling in the opposite direction (reflected wave from the free end), the fixed end seemingly recedes; however, the speed of electrons (or positive holes) is slower than the propagation rate of the progressive wave, and therefore the progressive wave finally catches the electrons and is reflected again. As a result, the progressive wave can be subjected to multipath reflection between the right and left boundaries, and its amplitude is amplified every time it reflects on the free end. From a different point of view, due to migration of electrons (or positive holes) that serve as the medium, the imaginary component of the eigenvalue of the resonator frequency becomes positive, and an unstable mode appears wherein amplitude increases with time. The progressive wave's amplitude increases as it repeatedly reflects in the resonator; however, the device gain that defines the upper limit thereof is restricted by the reflection loss at each boundary, and phase diffusion, energy diffusion, etc., in the resonator, and therefore device gain has a limited value.

Therefore, for example, by making the second (and the third) source electrode 113 to serve as a fixed end and the second drain electrode 114 to serve as a free end, and supplying direct current in such a manner that electrons (and positive holes) migrate from the second source electrode 113 to the second drain electrode 114, and further introducing the electrical signals having a suitable frequency to the first source electrode 107, the amplified signals are output from the first drain electrode 108. In other words, the device can serve as an amplification device. Furthermore, by feeding a portion of the output signals back to the input side, the device can function as an oscillation device. It is also possible to modulate the resonance frequency (amplification and oscillation) by changing the gate voltage.

Regarding such amplification and oscillation operations, it is readily possible to couple input and output signals with plasma oscillation by using a mode wherein high frequency signals are input to and output from the first source electrode 107 and drain electrode 108 that are coupled to the two-dimensional electron gas EG and the two-dimensional hole gas HG, by using the two-dimensional electron gas EG and the two-dimensional hole gas HG coupled to each other, or wherein direct current is supplied using the second source and drain electrodes 113, 114 (and the third source and drain electrodes).

(Third Embodiment)

Figure 6:
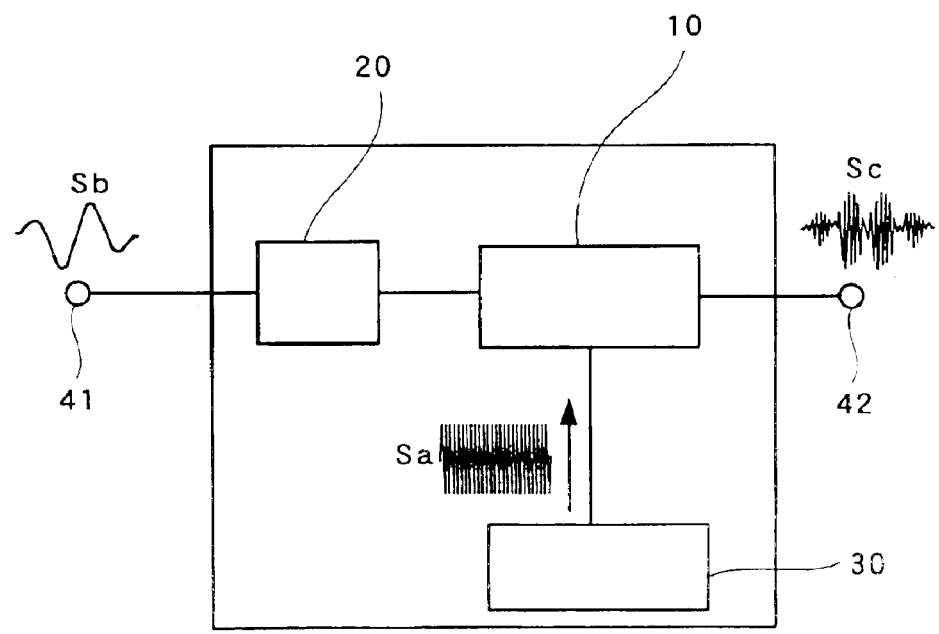
FIG. 6 shows a high-frequency modulator using the plasma oscillation switching device of the present invention.
Figure 7:
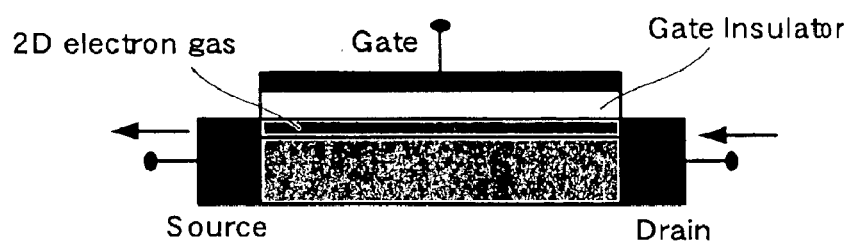
FIG. 7 is a cross-sectional view showing a prior art FET device as disclosed in document 1.
Figure 8:
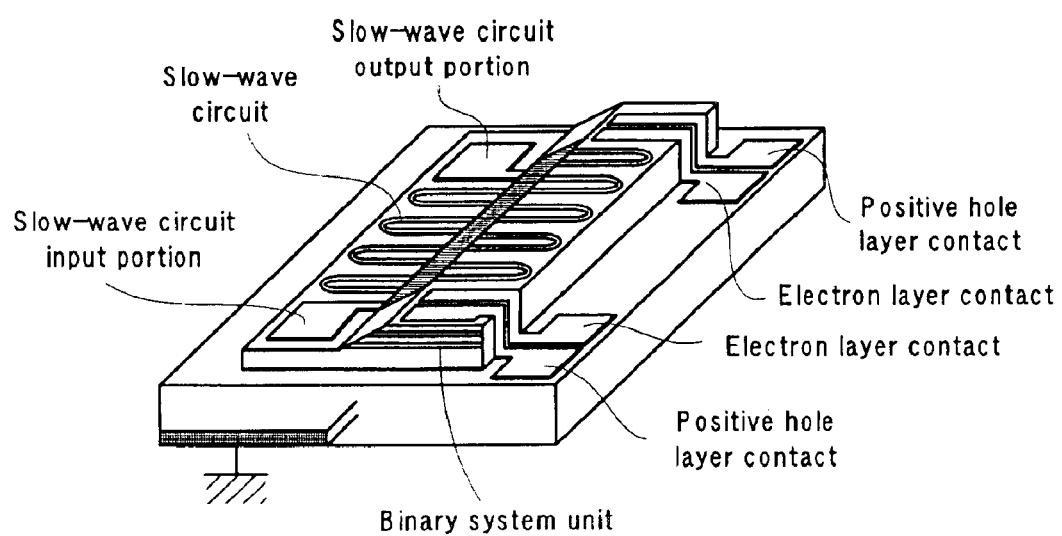
FIG. 8 is a perspective view showing a prior art electromagnetic wave amplifying device as disclosed in document 3.

Hereunder, the third embodiment of the present invention is explained with reference to the drawings. The present embodiment relates to a high frequency modulation device using the plasma oscillation switching device of the first embodiment. FIG. 6 schematically shows a high-frequency modulation device using the plasma oscillation switching device of the present invention.

As shown in FIG. 6, the high frequency modulation device comprises the plasma oscillation switching device 10 of the first embodiment, an input-matching circuit 20, and a high frequency signal generator 30. Furthermore, the input-matching circuit 20 is provided with input portion 41 to which modulation signals are input, and drain electrode 108 of the switching device 10 is provided with an output portion 42. The input-matching circuit 20 is connected to the gate electrode 109 of the switching device 10 and the high frequency generator 30 is connected to the source electrode 107.

The device having the above structure operates as follows: High frequency signals Sa of approximately 1000 GHz that are generated by the high frequency signal generator 30 are input to the switching device 10. Modulation signals Sb input from the input portion 41 are subjected to impedance matching in the input-matching circuit 20, and then input to the gate electrode 109 of the switching device 10. Here, in the switching device 10, as explained in the first embodiment, high frequency signals propagate from the source electrode 107 to the drain electrode 109, and these signals are controlled by the gate voltage. Therefore, the high frequency signals Sa input from the source electrode 107 are modulated as described above by the modulation signals Sb that have been input from the gate electrode 109 and then output from the drain electrode 108.

As described above, in the present embodiment, by using the plasma oscillation switching device of the first embodiment, it is possible to obtain a modulation device having a simple structure that can still be operated at high frequencies. With this structure, when an antenna is attached to the output portion 42, it becomes possible to emit the modulated high frequency signals Sc as output electromagnetic waves. Therefore, the modulation device can be used as a transmitter using high frequency electromagnetic waves. It is also possible to further provide an impedance-matching device between the switching device 10 and the antenna, or provide an amplifier in the input portion 41 or output portion 42. In the present embodiment, the plasma oscillation switching device of the first embodiment is used; however, needless to say, the plasma oscillation switching device of the second embodiment can also be used.

Embodiments of the present invention are explained above; however, the scope of the present invention is not limited to these embodiments and various modifications can be made as long as they do not depart from the essence of the invention. For example, the substrate 101 of the plasma oscillation switching device can be formed from other than InP, such as semi-insulating III-V compound semiconductors. It is also possible to form the substrate 101 from $Al_2O_3$ and like insulating substrates. When a semi-insulating or insulating substrate is used, electrostatic capacity of the switching device decreases, and therefore high frequency characteristics can be improved. Furthermore, this composition is advantageous in that, when a plurality of switching devices are fabricated, insulation between each device becomes easier.

In the above embodiments, in the first barrier layer 103, n-type diffusion layer 103*a* is formed, and, in the second barrier layer 105, p-type diffusion layer 105*a* is formed; however, the opposite arrangement is also possible. Specifically, the p-type diffusion layer can be formed in the first barrier layer 103 and the n-type diffusion layer can be formed in the second barrier layer 105. Furthermore, in the above embodiments, the materials forming each layer are selected in such a manner that the band gap of the channel layer 104 is smaller than the band gaps of the first and the second barrier layers 103, 105 as shown in FIG. 2; however, the structure is not limited to this, and other structures can be employed as long as the offset portions for accumulating the two-dimensional electrons gas EG and hole gas HG are formed at the boundaries between the barrier layers 103, 105 and the channel layer 104. Specifically, various structures can be employed as long as the energy (electron potential) at the conduction band edge of the barrier layer having an n-type diffusion layer is greater than that at the conduction band edge of the channel layer, and the energy at the valence band edge of the barrier layer having a p-type diffusion layer is smaller than that at the valence band edge of the channel layer. Here, it is preferable that the band gap offset be from 0.1 eV to 1.0 eV.

In the above embodiments, diffusion layers including doped impurities are formed in the barrier layers 103, 105 by delta doping; however, the following method can also be employed. For example, between the channel layer 104 and the diffusion layers 103*a*, 105*a*, undoped regions 103*b*, 105*b* having a predetermined thickness are formed in the barrier layers 103, 105, and impurities are doped in all parts of the barrier layers 103, 105 except in these undoped regions.

It is also possible to dope impurities throughout the barrier layers 103, 105, making fabrication thereof easier. However, as explained in the first embodiment, to efficiently generate plasma oscillation, it is preferable that undoped layers 103*b*, 105*b* be disposed with a predetermined distance between the channel layer 104 and diffusion layers 103*a*, 105*a*.

In the above embodiments, grounded common electrode 111 is arranged below the substrate 101; however, the position of the common electrode is not limited to this and the common electrode can be provided in the region 102 between the substrate 101 and the first barrier layer 103. It is also possible to dope impurities in the substrate 101 and provide a common electrode thereto. Furthermore, it is possible to provide an electrode that has Ohmic contact with at least one of the two-dimensional electrons gas and hole gas, and make this electrode serve as a common electrode. Such an independent common electrode is not necessarily required, and gate electrode 109 can also be used as a common electrode. However, from the view of efficiency of signal input or simplification of the circuit, it is preferable that a common electrode as described above be provided.

Industrial Applicability

The present invention provides a plasma oscillation switching device that can reliably operate at high frequency band.

What is claimed is:

1. A plasma oscillation switching device comprising:
   a substrate;
   a first barrier layer composed of a III-V compound semiconductor formed on the substrate;
   a channel layer composed of a III-V compound semiconductor formed on the first barrier layer;
   a second barrier layer composed of a III-V compound semiconductor formed on the channel layer; and
   a source electrode, a gate electrode and a drain electrode formed on the second barrier layer;
   wherein the first barrier layer includes either an n-type diffusion layer or a p-type diffusion layer, and the second barrier layer has a diffusion layer of the opposite type,
   the energy at the conduction band edge of the barrier layer having the n-type diffusion layer is larger than the energy at the conduction band edge of the channel layer, and the energy at the valence band edge of the barrier layer having the p-type diffusion layer is smaller than the energy at the valence band edge of the channel layer;
   two-dimensional electron gas is accumulated at the boundary between the barrier layer having the n-type diffusion layer and the channel layer, and two-dimensional hole gas is accumulated at the boundary between the barrier layer having the p-type diffusion layer and the channel layer; and
   the source electrode, the gate electrode, and the drain electrode are electrostatically coupled with the two-dimensional electron gas and two-dimensional hole gas.

2. A plasma oscillation switching device according to claim 1, wherein by applying high frequency signals to the source electrode, plasma oscillations are generated in the two-dimensional electrons gas and the two-dimensional hole gas, and these plasma oscillations are coupled to each other and propagated to the drain electrode.

3. A plasma oscillation switching device according to claim 1, wherein the difference between the energy at the conduction band edge of the barrier layer comprising the n-type diffusion layer and that at the conduction band edge of the channel layer, and the difference between the energy at the valence band edge of the barrier layer comprising the p-type diffusion layer and that at the valence band edge of the channel layer are from 0.1 eV or greater to 1.0 eV or less.

4. A plasma oscillation switching device according to claim 1, wherein the band gap of the channel layer is smaller than the band gaps of the first barrier layer and the second barrier layer.

5. A plasma oscillation switching device according to claim 1, wherein the channel layer contains N.

6. A plasma oscillation switching device according to claim 5, wherein the channel layer contains $N_xAs_{1-x}$ and the content ratio of N, when it is expressed as x, is from 0 or greater to 0.1 or less.

7. A plasma oscillation switching device according to claim 5, wherein the channel layer contains $N_xAs_{1-x}$ and the content ratio of N, when it is expressed as x, is from 0.01 or greater to 0.07 or less.

8. A plasma oscillation switching device according to claim 1, wherein each diffusion layer is disposed in such a manner that it is separated from the channel layer by 10 nm or larger to 100 nm or less.

9. A plasma oscillation switching device according to claim 1, wherein the substrate is provided with a grounded common electrode.

10. A plasma oscillation switching device according to claim 1, wherein high frequency signals having a frequency from 10 GHz or higher to 1000 GHz or lower are applied to the source electrode, and direct voltage or signals, having a frequency of from 0.1% or higher to 10% or lower of the frequency of the signals applied to the source electrode, is/are applied to the gate electrode.

11. A plasma oscillation switching device according to claim 1, wherein the source electrode, the gate electrode and the drain electrode are formed on the second barrier layer with an insulating layer in between.

12. A plasma oscillation switching device according to claim 1, wherein the source electrode, the gate electrode and the drain electrode form Schottky junctions with the second barrier layer.

13. A plasma oscillation switching device according to claim 1, wherein a second source electrode and a second drain electrode that have Ohmic contact with either or both of the two-dimensional electron gas and two-dimensional hole gas are formed so as to have the source electrode, the gate electrode and the drain electrode in between.

14. A plasma oscillation switching device according to claim 13, wherein direct voltage is applied across the second source electrode and the second drain electrode.

* * * * *